United States Patent
Gicquel et al.

(10) Patent No.: US 7,662,441 B2
(45) Date of Patent: Feb. 16, 2010

(54) HIGH-SPEED DIAMOND GROWTH USING A MICROWAVE PLASMA IN PULSED MODE

(75) Inventors: Alix Hélène Gicquel, Paris (FR); François Silva, Enghien (FR); Xavier Duten, Paris (FR); Khaled Hassouni, Le Kremlin-Bicetre (FR); Guillaume Vincent Lombardi, Rosny sur Seine (FR); Antoine Rousseau, Paris (FR)

(73) Assignees: Centre National de la Recherche Scientifique - CNRS, Paris (FR); Universite Paris Nord (Paris XII) Institut Galilee, Villettaneuse (FR)

( * ) Notice: Subject to any disclaimer, the term of this patent is extended or adjusted under 35 U.S.C. 154(b) by 0 days.

(21) Appl. No.: 10/541,970

(22) PCT Filed: Jun. 18, 2003

(86) PCT No.: PCT/EP03/07142

§ 371 (c)(1),
(2), (4) Date: Jul. 11, 2005

(87) PCT Pub. No.: WO2004/063430

PCT Pub. Date: Jul. 29, 2004

(65) Prior Publication Data

US 2006/0153994 A1 Jul. 13, 2006

(30) Foreign Application Priority Data

Jan. 10, 2003 (FR) .................................. 03 00254

(51) Int. Cl.
*H05H 1/24* (2006.01)
*H05H 1/20* (2006.01)
*H05H 1/22* (2006.01)

(52) U.S. Cl. ...................... 427/569; 427/906; 427/573; 427/577

(58) Field of Classification Search ................. 427/569, 427/577, 573
See application file for complete search history.

(56) References Cited

U.S. PATENT DOCUMENTS 4,985,227 A * 1/1991 Ito et al. ..................... 423/446

(Continued)

FOREIGN PATENT DOCUMENTS

EP  0 582 397 A2  7/1993

(Continued)

OTHER PUBLICATIONS

Vikharev et al., Comparison of pulsed and CW regimes of MPACVD reactor operation, Diamond and Related Materials 12 (2003) 272-276. Published online at www.sciencedirect.com Apr. 8, 2003.*

(Continued)

*Primary Examiner*—Timothy Meeks
*Assistant Examiner*—Kelly M Gambetta
(74) *Attorney, Agent, or Firm*—McDonnell Boehnen Hulbert & Berghoff LLP

(57) ABSTRACT

Disclosed is a method for manufacturing a diamond film of electronic quality at a high rate using a pulsed microwave plasma. The plasma that has a finite volume is formed near a substrate (in a vacuum chamber) by subjecting a gas containing at least hydrogen and carbon to a pulsed discharge. The pulsed discharge has a succession of low-power states and of high-power states and a peak absorbed power $P_C$, in order to obtain carbon-containing radicals in the plasma. These carbon-containing radicals are deposited on the substrate in order to form a diamond film. Power is injected into the volume of the plasma with a peak power density of at least 100 W/cm$^3$, while maintaining the substrate to a substrate temperature of between 700° C. and 1000 ° C.

7 Claims, 1 Drawing Sheet

U.S. PATENT DOCUMENTS

| | | | | |
|---|---|---|---|---|
| 5,240,749 A | * | 8/1993 | Chow | 427/575 |
| 5,260,106 A | * | 11/1993 | Kawarada et al. | 427/577 |
| 5,518,759 A | * | 5/1996 | Sevillano et al. | 427/10 |
| 5,560,779 A | * | 10/1996 | Knowles et al. | 118/723 MP |
| 5,626,922 A | * | 5/1997 | Miyanaga et al. | 427/535 |
| 5,643,365 A | * | 7/1997 | Blinov et al. | 118/723 MW |
| 5,993,919 A | * | 11/1999 | Tsuno et al. | 427/577 |
| 6,110,542 A | * | 8/2000 | Miyanaga et al. | 427/577 |
| 6,200,183 B1 | | 3/2001 | Badzian et al. | 445/24 |
| 6,261,424 B1 | | 7/2001 | Goncharenko et al. | 204/192.38 |

FOREIGN PATENT DOCUMENTS

| | | | |
|---|---|---|---|
| EP | 0 635 584 A1 | | 7/1994 |
| JP | 01157496 A | * | 6/1989 |
| WO | WO 01/96633 A1 | | 6/2001 |
| WO | WO 01/96634 A1 | | 6/2001 |

OTHER PUBLICATIONS

Gicquel, et al., *Journal of Applied Physics*, Jun. 15, 1998, vol. 83, No. 12, pp. 7504-7521.

Gicquel, et al., *Materials Research*, 2003, vol. 6, No. 1 pp. 25-37.

Gordon, et al., *Journal of Applied Physics*, Feb. 1, 2001, vol. 89, No. 3, pp. 1544-1549.

Hassouni, et al., *Plasma Sources Science and Technology*, 2001, vol. 10, pp. 61-75.

Lombardi, et al., *Journal of the Electrochemical Society*, 2003, vol. 150, No. 5, pp. C311-C319.

Lombardi, et al., "Diagnostics and Modeling of Moderate Pressure Microwave $H_2/CH_4$ Plasmas Obtained Under Pulsed Mode" paper, 2001.

Silva, et al., *Diamond and Related Materials*, 1996, vol. 5, pp. 338-344.

Lombardi, et al., "Diagnostics and modeling of moderate pressure microwave $H_2/C_4$ plasmas obtained under pulsed mode", ISPC, Orléans, Jul. 2001.

Lombardi, et al., "Diagnostics and modeling of moderate pressure microwave $H_2/C_4$ plasmas obtained under pulsed mode", Proceedings ECS, San Francisco, Sep. 2001.

\* cited by examiner

HIGH-SPEED DIAMOND GROWTH USING A MICROWAVE PLASMA IN PULSED MODE

The present invention relates to a method for manufacturing diamond using a pulsed microwave plasma.

BACKGROUND OF THE INVENTION

Current methods for manufacturing diamond films by microwave-plasma-assisted chemical vapor deposition (MP-CVD) are of limited effectiveness. The large amounts of energy, which are needed to obtain diamond of electronic quality at reasonable growth rates (about 2 µm/h), lead to heating of the walls. This process causes hydrogen atoms in the plasma, which activate the reaction, to recombine and not participate in the reaction. It is therefore necessary to install a constricting device for cooling the walls. In the proceedings of the Electrical Chemical Society (ECS) meeting held in San Francisco in 2001, it was proposed in "Diagnostics and modelling of moderate pressure microwave $H_2/CH_4$ plasmas obtained under pulsed mode" by a number of co-inventors to use a periodic pulsed discharge with a low duty cycle (the ratio of the time during which energy is emitted to the period of the discharge), in order to reduce the wall temperature, which is related to the average injected power, and therefore the recombination of hydrogen taking place thereon. Using such a pulsed discharge makes it possible to maintain a high temperature of the plasma, which is related to the power injected during the pulse, and therefore to obtain a higher concentration of hydrogen atoms in the plasma. Thus, a diamond film may be deposited at a higher rate for constant consumed power.

BRIEF SUMMARY OF THE INVENTION

The invention relates to a method of this type in which, in a vacuum chamber, a plasma of finite volume is formed near a substrate by subjecting a gas containing at least hydrogen and carbon to a pulsed discharge, which has a succession of low-power states and high-power states, and having a peak absorbed power $P_C$, so as to obtain at least carbon-containing radicals in the plasma and to deposit the said carbon-containing radicals on the substrate in order to form a diamond film thereon.

The object of the present invention is to further improve these methods, especially their efficiency.

For this purpose, the invention provides a process for manufacturing a diamond film assisted by a pulsed microwave plasma, which, apart from the above mentioned features, is characterized in that power is injected into the volume of the plasma with a peak power density of at least 100 $W/cm^3$ while maintaining the substrate to a substrate temperature of between 700° C. and 1000° C.

By virtue of these arrangements, it is possible to obtain rapid growth of a diamond film, especially of electronic quality, on the substrate.

In preferred embodiments of the invention, one or more of the following arrangements may optionally be furthermore employed:
  a plasma having at least one of the following features is generated near the substrate:
    the pulsed discharge has a certain peak absorbed power $P_C$ and the ratio of the peak power to the volume of the plasma is between 100 $W/cm^3$ and 250 $W/cm^3$,
    the maximum temperature of the plasma is between 3500 K and 5000 K,
    the temperature of the plasma in a boundary region of the plasma located less than 1 cm from the surface of the substrate is between 1500 K and 3000 K and
    the plasma contains hydrogen atoms having a maximum concentration in the plasma of between $1.7 \times 10^{16}$ and $5 \times 10^{17}$ $cm^{-3}$;
  said gas contains carbon and hydrogen in a carbon/hydrogen molar ratio of between 1% and 12%;
  said gas contains at least one hydrocarbon and a plasma having a concentration of the carbon-containing radicals of between $2 \times 10^{14}$ $cm^{-3}$ and $1 \times 10^{15}$ $cm^{-3}$ is generated;
  a pulsed discharge is produced, in which the ratio of the duration of the high-power state to the duration of the low-power state is between 1/9 and 1;
  at least one of the following parameters is estimated:
    a substrate temperature,
    a temperature of the plasma,
    a temperature of the plasma in said boundary region, located less than 1 cm from the surface of the substrate,
    a concentration of atomic hydrogen in the plasma,
    a concentration of carbon-containing radicals in the plasma,
    a concentration of carbon-containing radicals in said boundary region close to the plasma,
    a pressure of the plasma and
    a power density of the plasma, and the power emitted as a function of time is adapted according to at least one of these parameters;
  the plasma is contained in a cavity with at least one of the following properties:
    the pulsed discharge has a peak power of at least 5 kW at 2.45 GHz,
    the pressure of the plasma is between 100 mbar and 350 mbar and
    the gas containing hydrogen and carbon is emitted with a ratio of the flow rate to the volume of the plasma of between 0.75 and 7.5 $sccm/cm^3$;
  the plasma is contained in a cavity with at least one of the following properties:
    the pulsed discharge has a peak power of at least 10 kW at 915 MHz,
    the pressure of the plasma is between 100 mbar and 350 mbar and
    the gas containing hydrogen and carbon is emitted with a ratio of the flow rate to the volume of the plasma of between 0.75 and 7.5 $sccm/cm^3$.

Other aspects, objects and advantages of the invention will become apparent on reading the description of one of its embodiments which is given as a non-limiting example.

BRIEF DESCRIPTION OF THE DRAWINGS

The invention will also be more clearly understood from the drawings, in which.

In the various figures, the same references denote identical or similar elements.

DETAILED DESCRIPTION OF THE INVENTION

Figure 1:
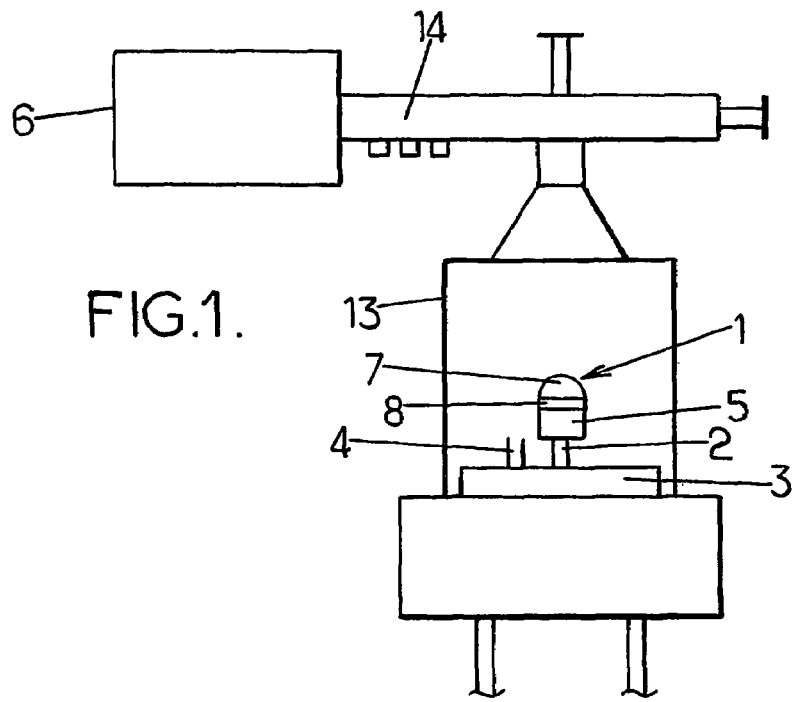
FIG. 1 shows one embodiment of the method according to the invention.

FIG. 1 shows an example of how to implement the method according to the invention using a vacuum chamber 1 containing a support 2 placed on its base 3. This vacuum chamber is placed in a Faraday cage 13 acting as a cavity or the vacuum chamber itself acts as a cavity. Also, in the vacuum chamber is a single injection nozzle 4 or a plurality of injection nozzles. The injection nozzle emits, into the vacuum chamber, gases comprising: a) a source of molecular hydrogen, such as dihydrogen ($H_2$): and b) a source of carbon, such as a hydrocarbon like methane ($CH_4$), carbon dioxide ($CO_2$) or like.

Controlled amounts of argon (Ar) or of dopants and impurities, such as boron (B), sulphur (S), phosphorus (P) or other dopants, may furthermore be emitted by the injection nozzle 4.

Positioned on the support 2 is a substrate 5, which for example may be a single-crystal or polycrystalline, natural or synthetic, diamond substrate, or even a non-diamond substrate, such as a silicon substrate, whether biased or not, an SiC substrate or an iridium or platinum substrate for example.

The gases emitted by the injection nozzle 4 expand into the vacuum chamber and are exposed to a discharge generated by a microwave generator 6 such as a GE 60KEDC SAIREM microwave generator operating at 2.45 GHz or a microwave generator operating at 915 MHz, the microwaves being guided by a waveguide 14. This discharge is coupled to the cavity 13 in such a way that the gases form, around the substrate 5, a plasma 7 comprising, apart from the molecules of the gases:

hydrogen atoms H and carbon-containing radicals, for example those in the form of $CH_3$, and in general in the form of $C_xH_y$ or the like.

The plasma 7 may adopt an almost hemispherical shape, for example with a diameter of between 5 cm and 10 cm or other, about the substrate 5. The carbon atoms contained in the plasma 7 are deposited on the substrate 5 and form a diamond film 8.

The substrate 5 and the diamond film 8 are heated by the surrounding plasma 7 up to a substrate temperature $T_S$ of around 700° C. to 1000° C. Furthermore, the temperature of the substrate and of the film may be regulated by a regulating device (not shown) suitable for heating and/or cooling the substrate, this device being contained for example in the support 3. This makes it possible, during implementation of the method, to decouple the injected power parameters from the substrate temperature parameters.

Figure 2A:
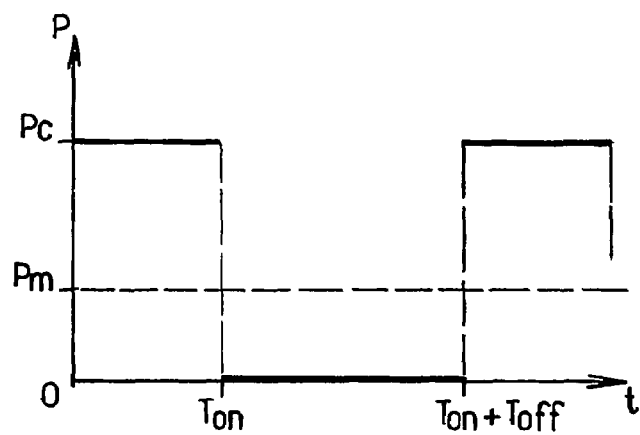
FIGS. 2a and 2b are graphs showing a pulsed discharge according to the invention.

The power generated by the microwave generator 6 is illustrated in FIG. 2a. This power is periodic with time and has, over a period T:

a peak power $P_C$ for a heating time $T_{on}$ and then a low power, relative to the high power, which might be almost zero, for a standby time $T_{off}$.

The signal is not necessarily strictly periodic during the method, and the durations of the heating and standby times $T_{on}$ and $T_{off}$ may vary, for example depending on the conditions measured in the plasma.

Likewise, the emitted power is not necessarily a square wave. For any periodic signal, it is possible, over a period, to calculate the mean $P_m$ of the emitted power. The emitted power greater than the mean power defines the heating time $T_{on}$ and is called hereafter the "high power". The high power has a maximum instantaneous value called the "peak power" $P_C$. The emitted power less than the mean power defines the standby time $T_{off}$ and is called hereafter the "low power". The times $T_{on}$ and $T_{off}$ are optionally fractionated over a period.

Within the context of the invention, the peak power $P_C$ may have a value of between 5 kW and 60 kW.

The duty cycle of the microwave generator 6, equal to the ratio of the heating time $T_{on}$ to the period $T=T_{on}+T_{off}$, is between 10% and 50%. Thus, the ratio of the time when high power is emitted to the time when low power is emitted may be between 1/9 and 1.

Apart from in a transient regime at the start of the heating time $T_{on}$, having a duration much less than $T_{on}$, during which the plasma volume varies, principally increasing, the plasma has during the heating time $T_{on}$ a generally constant volume directly related to the pressure of the plasma, which in practice is between approximately 100 mbar and 350 mbar, and to the microwave frequency of the microwave generator used. The rest of the description ignores the transient state occurring at the start of the heating time, taking into account only the "steady state" of the plasma that occurs thereafter.

Such a periodic pulsed discharge is used to obtain a pulsed plasma whose temperature remains high, thereby guaranteeing high concentrations of hydrogen atoms H and carbon-containing radicals and therefore a high deposition rate, while maintaining a low temperature of the walls 13 of the vacuum chamber 1. With such an absorbed power, the temperature of the plasma 7 rises up to a maximum value of between 3500 K and 5000 K. Consequently, and depending on the volume of the plasma 7, the power density corresponding to the peak power injected into the plasma is between 100 W/cm$^3$ and 250 W/cm$^3$. This power density is calculated as the ratio of the peak power $P_C$ to the volume of the plasma 7, which may be measured by specific measurement means such as, for example, optical spectroscopy, or by a high-speed optical camera of the "Flash Cam" type, for example in the visible range, or by other means. The gas temperature in a boundary region of the plasma, located less than 1 cm from the surface of the substrate, between the substrate and the generator, may also be between 1500 K and 3000 K.

These conditions greatly favor the disruption of the molecular hydrogen $H_2$ emitted by the injection nozzle 4 and the formation of carbon-containing radicals. A concentration between $1.7 \times 10^{16}$ cm$^{-3}$ and $5 \times 10^{17}$ cm$^{-3}$ of atomic hydrogen in the plasma may be measured. Such atomic hydrogen concentrations make it possible to increase the reaction rate for depositing the carbon-containing radicals contained in the plasma in the form of a diamond to a high reaction rate, while guaranteeing the electronic quality of the diamond film produced. These conditions thus advantageously allow the concentration of carbon-containing radicals in the plasma to be increased so that the latter may contain between $2 \times 10^{14}$ cm$^{-3}$ and $1 \times 10^{15}$ cm$^{-3}$ $CH_3$ radicals. Since the incorporation of carbon atoms into the diamond film 8 being formed is substantial, the molecular methane may be emitted by the injection nozzle 4 with a molar ratio of possibly up to 12% (with respect to molecular hydrogen, $H_2$).

In the considered embodiment, the volume of the plasma is kept overall constant at 65 cm$^3$ by a flow via the injection nozzle 4 with a flow rate of between 50 sccm and 500 sccm, which corresponds to a ratio of the flow rate to the volume of plasma of between 0.75 and 7.5 sccm/cm$^3$ for example. Of course, it is unnecessary for the plasma to maintain a constant volume during the method, nor indeed does this volume have to be around 65 cm$^3$. The volume of the plasma may be modified by regulating its pressure within the 100 mbar-350 mbar range. Furthermore, the volume of the plasma may also be increased or reduced by using a microwave generator at a lower or higher microwave frequency respectively.

As explained above, using a controlled pulsed discharge allows the characteristics of the plasma to be increased, in particular the atomic hydrogen and carbon-containing radical concentrations therein, since the temperature of the plasma can be increased while the wall temperature, directly related to the mean power of the discharge, remains low. The significant parameters governing the growth of the diamond film are thus directly related to the peak power.

Thus, by reducing the heating time $T_{on}$ for a given period, and for a given mean power, the peak power $P_C$ may be increased up to maximum values ranging from 6 kW to 60 kW, depending on the generator used. The reaction rate is related to the concentration of atomic hydrogen and of carbon-containing radicals in the plasma 7 and by the temperature of the substrate $T_S$. On the other hand, the mean power of the discharge cycle must remain low so as to avoid an excessively high temperature of the walls 13 of the vacuum chamber 1, which leads, for a constant period T of the discharge cycle, to reducing the heating time $T_{on}$ and increasing the standby time $T_{off}$. During that part of the discharge cycle between $T_{on}$ and T, a low, even zero, microwave power is injected into the plasma 7 so that the radicals in this plasma recombine. Thus, the concentration of atomic hydrogen H in the plasma 7 decreases during this time interval and the atoms recombine into hydrogen molecules $H_2$, which again will have to be disrupted during the next discharge, thereby reducing the efficiency of the process. During the standby time $T_{off}$, the atomic hydrogen concentration decreases with time, characterized by a lifetime $T_V$ of the hydrogen atoms in the plasma that depends on the temperature and pressure conditions of the plasma. It is desirable to try to limit the process of hydrogen atoms recombining during the standby time $T_{off}$ so as to have to disrupt the minimum amount of hydrogen molecules $H_2$ during the next heating time $T_{on}$.

The invention makes it possible to obtain a pulsed microwave plasma using an energy source 6 delivering a periodic discharge with time, the standby time $T_{off}$ of which is strictly shorter than the lifetime $T_V$ of the hydrogen atoms in the plasma 7.

Figure 2B:
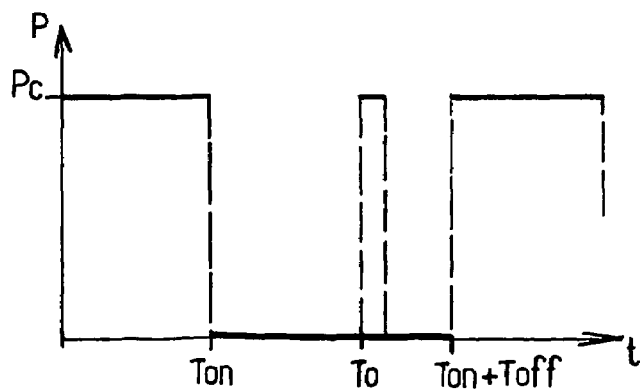

The lifetime $T_V$ of the atomic hydrogen H in the plasma 7 may be determined, for example, by a known plasma induced fluorescence (PIF) technique. As shown in FIG. 2b, PIF technique consists of generating the first power peak that has the duration $T_{on}$ and the peak power $P_C$, and the second power peak that occurs at a defined time $T_0$ taken between $T_{on}$ and T. The second peak is of short duration, for example about 1/10 of $T_{on}$. The second peak, by direct collision with an electron, excites the hydrogen atoms H still present in the plasma 7 at time $T_0$. This excitation is measured and compared with the excitation caused by the first peak of the discharge, thereby making it possible to determine the concentration of hydrogen atoms H remaining in the plasma 7 at time $T_0$. Determining the concentration of hydrogen atoms remaining in the plasma thus allows to determine the hydrogen atom lifetime under the given conditions of the plasma. Optionally, this information may be transmitted to the microwave generator 6 which adapts the parameters of the discharge accordingly. Other known techniques, such as laser-induced stimulated emission (LISE) or two photon laser-induced fluorescence may be used in this context.

Measures may also be taken to ensure that, during the standby time $T_{off}$, a residual power $P_R$ of about 10% of the peak power $P_C$ is injected into the plasma so that the microwave generator 6 remains active and can deliver more rapidly, at the start of each new discharge cycle period, a high peak power $P_C$.

The invention claimed is:

1. A method for manufacturing a diamond film comprising:
    forming a plasma of finite volume near a substrate by subjecting a gas containing at least hydrogen and carbon in a vacuum chamber to periodic pulsed discharges using a pulsed microwave plasma by applying only a repeated succession of a low-power state and a high-power state, in which the ratio of the duration of the high-power state to the duration of the low-power state is between 1/9 and 1, and having a peak absorbed power $P_C$ so as to obtain at least carbon-containing radicals in the plasma, and depositing the said carbon-containing radicals on the substrate in order to form a diamond film thereon;
    wherein the power being injected into the volume of the plasma with a peak power density of at least 100 $W/cm^3$ while maintaining the substrate to a substrate temperature of between 700° C. and 1000° C. and also wherein the pressure of the plasma is maintained between 100 mbar and 350 mbar.

2. The method according to claim 1, in which a plasma having at least one of the following features is generated near the substrate:
    the peak power density of the plasma is between 100 $W/cm^3$ and 250 $W/cm^3$,
    the maximum temperature of the plasma is between 3500 K and 5000 K,
    the temperature of the plasma in a boundary region of the plasma located less than 1 cm from the surface of the substrate is between 1500 K and 3000 K and
    the plasma contains hydrogen atoms having a maximum concentration in the plasma of between $1.7 \times 10^{16}$ and $5 \times 10^{17}$ $cm^{-3}$.

3. The method according to claim 1 or claim 2, in which said gas contains carbon and hydrogen in a carbon/hydrogen molar ratio of between 1% and 12%.

4. The method according to claim 1, in which said gas contains at least one hydro-carbon, and a plasma having a concentration of the carbon-containing radicals of between $2 \times 10^{14}$ $cm^{-3}$ and $1 \times 10^{15}$ $cm^{-3}$ is generated.

5. The method according to claim 1, in which at least one of the following parameters is estimated:
    a substrate temperature,
    a temperature of the plasma,
    a temperature of the plasma in said boundary region, located less than 1 cm from the surface of the substrate,
    a concentration of atomic hydrogen in the plasma,
    a concentration of carbon-containing radicals in the plasma,
    a concentration of carbon-containing radicals in said boundary region close to the plasma,
    a pressure of the plasma and
    a power density of the plasma,
and the power emitted as a function of time is adapted according to at least one of these parameters.

6. The method according to claim 1, in which the plasma is contained in a cavity with at least one of the following properties:
    the periodic pulsed discharges have a peak power of at least 5 kW at 2.45 GHz and
    the gas containing hydrogen and carbon is emitted with a ration of the flow rate to the volume of plasma of between 0.75 and 7.5 $sccm/cm^3$.

7. The method according to claim 1, in which the plasma is contained in a cavity with at least one of the following properties:
    the periodic pulsed discharges have a peak power of at least 10 kW at 915 MHz and
    the gas containing hydrogen and carbon is emitted with a ratio of the flow rate to the volume of the plasma of between 0.75 and 7.5 $sccm/cm^3$.

* * * * *